US009251618B2

(12) United States Patent
Kautzman et al.

(10) Patent No.: US 9,251,618 B2
(45) Date of Patent: Feb. 2, 2016

(54) SKIN AND FLESH SIMULATION USING FINITE ELEMENTS, BIPHASIC MATERIALS, AND REST STATE RETARGETING

(71) Applicants: Ryan Kautzman, San Francisco, CA (US); Jiayi Chong, San Bruno, CA (US); Patrick Coleman, Oakland, CA (US)

(72) Inventors: Ryan Kautzman, San Francisco, CA (US); Jiayi Chong, San Bruno, CA (US); Patrick Coleman, Oakland, CA (US)

(73) Assignee: PIXAR, Emeryville, CA (US)

( * ) Notice: Subject to any disclaimer, the term of this patent is extended or adjusted under 35 U.S.C. 154(b) by 321 days.

(21) Appl. No.: 13/843,923

(22) Filed: Mar. 15, 2013

(65) Prior Publication Data
US 2014/0002463 A1 Jan. 2, 2014

Related U.S. Application Data

(60) Provisional application No. 61/665,102, filed on Jun. 27, 2012.

(51) Int. Cl.
G06T 13/40 (2011.01)
G06F 17/50 (2006.01)

(52) U.S. Cl.
CPC ............ G06T 13/40 (2013.01); G06F 17/5018 (2013.01)

(58) Field of Classification Search
None
See application file for complete search history.

(56) References Cited

U.S. PATENT DOCUMENTS

| 2002/0180739 A1* | 12/2002 | Reynolds et al. ............ 345/474 |
| 2003/0088389 A1* | 5/2003 | Balaniuk et al. .................. 703/2 |
| 2005/0253854 A1* | 11/2005 | Lischinski et al. ............ 345/474 |
| 2007/0239409 A1* | 10/2007 | Alan ................................ 703/2 |

OTHER PUBLICATIONS

Stable, Art-Directable Skin and Flesh Using Biphasic Materials Ryan Kautzman, Jiayi Chong, Patrick Coleman_Aug. 5-9, 2012.*
Invertible Finite Elements for Robust Simulation of Large Deformation G. Irving, J. Teran, and R. Fedkiw§ 2004.*
Simulating the Devolved: Finite Elements on Wall•E Geoffrey Irving_Ryan Kautzman_Gordon Cameron_Jiayi Chong Aug. 11-15, 2008.*
Irving et al., "Invertible Finite Elements for Robust Simulation of Large Deformation," Proceedings of SCA 2004, pp. 131-140.
Irving et al., "Simulating the Devolved: Finite Elements on Wall•E," in SIGGRAPH 2008 Talks, 1 page.

* cited by examiner

*Primary Examiner* — Stephen R Koziol
*Assistant Examiner* — Jason Pringle-Parker
(74) *Attorney, Agent, or Firm* — Patterson & Sheridan, LLP

(57) ABSTRACT

The movement of skin on an animated target, such as a character or other object, is simulated via a simulation software application. The software application creates a finite element model (FEM) comprising a plurality of finite elements based on an animated target. The software application attaches a first constraint force to a node associated with a first finite element in the plurality of finite elements. The software application attaches a second constraint force to the node. The software application detects a movement of the first finite element that results in a corresponding movement of the node. The software application determines a new position for the node based on the movement of at least one of the first finite element, the first constraint force, and the second constraint force.

15 Claims, 6 Drawing Sheets

SKIN AND FLESH SIMULATION USING FINITE ELEMENTS, BIPHASIC MATERIALS, AND REST STATE RETARGETING

CROSS-REFERENCE TO RELATED APPLICATIONS

This application claims the priority benefit of provisional U.S. patent application entitled "SKIN AND FLESH SIMULATION USING FINITE ELEMENTS, BIPHASIC MATERIALS, AND REST STATE RETARGETING," Ser. No. 61/665,102, filed Jun. 27, 2012, which is hereby incorporated herein by reference.

BACKGROUND OF THE INVENTION

1. Field of the Invention

The present invention relates to the field of computer animation and, in particular, to skin and flesh simulation using finite elements, biphasic materials, and rest state retargeting.

2. Description of the Related Art

Computer-based animations often involve modeling the behavior of flesh and skin on characters and other objects such that skin and flesh move in a believable and visually pleasing manner when the characters are animated. The movement of skin and flesh is simulated by using a physics-based simulation software application. Such a software application determines the position of a character's skin and flesh based on the movement of the character and the model used for the flesh and skin. One approach for modeling flesh involves a material with a specific stiffness, such that flesh stretches as the underlying character moves and deforms. The animator selects a proper stiffness that causes the character's flesh to move in a plausible manner as the character undergoes various basic movements, such as walking, crawling, or running.

One drawback of this approach is that, while such a model may provide plausible flesh movement when the character undergoes movement involving small deformations, the model behaves poorly when the character undergoes larger deformation. For example, a stiffness value could be selected to creates plausible flesh movement for low deformation actions such as walking. The same stiffness value may cause the character's flesh to separate, or rip away, from the character if the character undergoes a rapid change in motion, such as jumping off a bridge. As a result, animators may need to manually adjust each shot to achieve plausible flesh motion, particularly when a character undergoes a sudden change in momentum. For example, an animator could add an inertial field generator associated with the character, so causing the simulator to believe the character is not actually jumping off a bridge. Such manual per-shot approaches are time consuming for the animator, and thus increase production costs and production cycles.

Skin motion may be simulated by using a mass-spring system. With such an approach, discrete nodes in space are each assigned a mass. The nodes are interconnected via springs, where the springs are models for forces that allow the skin to deform and then to restore to an original position as the underlying character animates. The interconnected nodes form a mesh that surrounds the character. One set of springs attempts to maintain the relative positions of the masses by maintaining the length of the edges connecting the masses. Potentially a second set of springs attempts to maintain the areas of the triangles formed by the mesh that interconnects the nodes. Typically, such mass-spring models exhibit linear stretching behavior. One drawback of this approach is that each spring in mass-spring systems typically attempts to maintain the spring's initial, or reference, length, resulting in an incorrect visual appearance of the skin or flesh as the animated character experiences sudden or exaggerated motion. Another drawback of this approach is that such mass-spring models can cause the skin to stretch unrealistically across portions of the character while compressing and folding over in others portions of the character. As a result, such mass-spring models typically involve multiple simulation parameter sets for different classes of motion, resulting in increased simulation setup time for each different shot.

SUMMARY OF THE INVENTION

One embodiment of the present invention includes a method for simulating movement of skin associated an animated target. The method includes creating a finite element model (FEM) comprising a plurality of finite elements based on an animated target. The method further includes attaching a first constraint force and a second constraint force to a node associated with a finite element in the plurality of finite elements. The method further includes detecting a movement of the first finite element that results in a corresponding movement of the node, and determining a new position for the node based on the movement of at least one of the first finite element, the first constraint force, and the second constraint force.

Other embodiments include, without limitation, a computer-readable storage medium that includes instructions that enable a processing unit to implement one or more aspects of the disclosed methods as well as a computing system configured to implement one or more aspects of the disclosed methods.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention involve skin and flesh simulation using finite elements, biphasic materials, and rest state retargeting. Other embodiments may include various subcombinations of these techniques. In one embodiment, skin and flesh may be simulated using finite elements. In another embodiment, skin and flesh may be simulated using finite elements and biphasic response. In another embodiment, skin and flesh may be simulated using finite elements and rest state retargeting.

In yet another embodiment, skin and flesh may be simulated using biphasic response and rest state retargeting, where the skin silhouette may be calculated implicitly using a closed form solution, and the skin simulation may be calculated explicitly without the silhouette using hybrid time integration. In such a case, the skin silhouette may be calculated in real time without iterative steps.

In one embodiment, a hybrid time integration technique is utilized to simulate skin and flesh on a computer animatable model, combining an adaptive semi-implicit material update and a fully-implicit update for resolving the tracking forces. As a result, high quality deformation and efficient tracking of sliding skin and flesh is accomplished.

In some embodiments, a continuous surface of skin or flesh is modeled resulting in greater flexibility of dynamic response. In such a system, various features are possible, including, without limitation, plastic deformation where the shape of a simulation mesh may be transformed in response to a physical event; transferring a volume lost during a skin or flesh simulation to neighboring elements on the simulation mesh; or dynamically change the rest state of the skin or flesh. Further, inverted triangles within the simulation mesh may be properly corrected while maintaining a correct visual effect.

Hardware Overview

Figure 1:
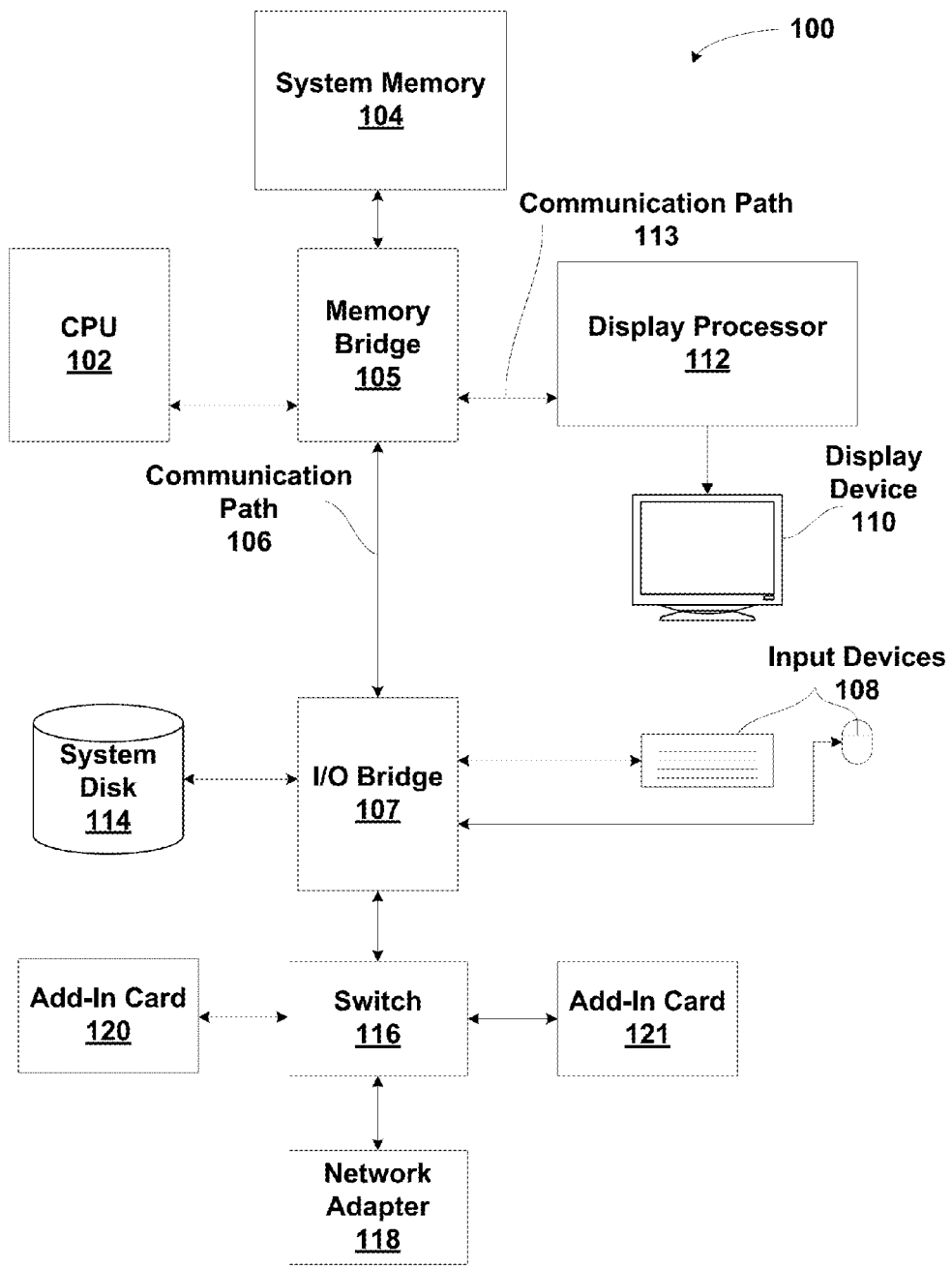
FIG. 1 is a block diagram of a system configured to implement one or more aspects of the invention.

FIG. 1 depicts one architecture of a system 100 within which embodiments of the present invention may be implemented. This figure in no way limits or is intended to limit the scope of the present invention.

System 100 may be a personal computer, video game console, personal digital assistant, rendering engine, or any other device suitable for practicing one or more embodiments of the present invention.

As shown, system 100 includes a central processing unit (CPU) 102 and a system memory 104 communicating via a bus path that may include a memory bridge 105. CPU 102 includes one or more processing cores, and, in operation, CPU 102 is the master processor of system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A display processor 112 is coupled to memory bridge 105 via a bus or other communication path (e.g., a PCI Express, Accelerated Graphics Port, or HyperTransport link); in one embodiment display processor 112 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104.

Display processor 112 periodically delivers pixels to a display device 110 (e.g., a screen or conventional CRT, plasma, OLED, SED or LCD based monitor or television). Additionally, display processor 112 may output pixels to film recorders adapted to reproduce computer generated images on photographic film. Display processor 112 can provide display device 110 with an analog or digital signal.

A system disk 114 is also connected to I/O bridge 107 and may be configured to store content and applications and data for use by CPU 102 and display processor 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, display processor 112 incorporates circuitry optimized for graphics and video processing, including, for example, video output circuitry, and constitutes a graphics processing unit (GPU). In another embodiment, display processor 112 incorporates circuitry optimized for general purpose processing. In yet another embodiment, display processor 112 may be integrated with one or more other system elements, such as the memory bridge 105, CPU 102, and I/O bridge 107 to form a system on chip (SoC). In still further embodiments, display processor 112 is omitted and software executed by CPU 102 performs the functions of display processor 112.

Pixel data can be provided to display processor 112 directly from CPU 102. In some embodiments of the present invention, instructions and/or data representing a scene are provided to a render farm or a set of server computers, each similar to system 100, via network adapter 118 or system disk 114. The render farm generates one or more rendered images of the scene using the provided instructions and/or data. These rendered images may be stored on computer-readable media in a digital format and optionally returned to system 100 for display. Similarly, stereo image pairs processed by display processor 112 may be output to other systems for display, stored in system disk 114, or stored on computer-readable media in a digital format.

Alternatively, CPU 102 provides display processor 112 with data and/or instructions defining the desired output images, from which display processor 112 generates the pixel data of one or more output images, including characterizing and/or adjusting the offset between stereo image pairs. The data and/or instructions defining the desired output images can be stored in system memory 104 or graphics memory within display processor 112. In an embodiment, display processor 112 includes 3D rendering capabilities for generating pixel data for output images from instructions and data defining the geometry, lighting shading, texturing, motion, and/or camera parameters for a scene. Display processor 112 can further include one or more programmable execution units capable of executing shader programs, tone mapping programs, and the like.

CPU 102, render farm, and/or display processor 112 can employ any surface or volume rendering technique known in the art to create one or more rendered images from the provided data and instructions, including rasterization, scanline rendering REYES or micropolygon rendering, ray casting, ray tracing, image-based rendering techniques, and/or combinations of these and any other rendering or image processing techniques known in the art.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies display processor 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Animating computer-generated characters often involves simulating ballistic flesh and skin motion that tracks a variety of exaggerated art directed animated performances. The techniques described herein provide specific ballistic behavior for skin and flesh by employing constitutive models that work across a range of situations. Biphasic constitutive models adapt the simulation parameters in such a way that flesh and the skin motion remains stable in the presence of large forces and fast accelerations. Given a finite element model (FEM) flesh simulation model, a finite element model for sliding skin allows the skin model to properly track the flesh motion. A hybrid time integration scheme provides high-quality deformation and efficient tracking during the sliding skin simulation. The techniques combine an adaptive semi-implicit material update and a fully-implicit update for resolving the tracking forces. Finally, the constitutive models described herein dynamically retarget the respective model's FEM rest state such that the simulated shape more closely tracks target shapes of the input animation. The decoupled biphasic models described herein allow non-technical users to work with stable simulation rigs that perform robustly in a wide variety of shots. To mitigate complexity in achieving art directed results, volumetric flesh and sliding skin are simulated independently. Because each simulation is independent, animators may apply local edits to independently attenuate or exaggerate the volumetric and sliding responses to match specific art direction.

Figure 2:
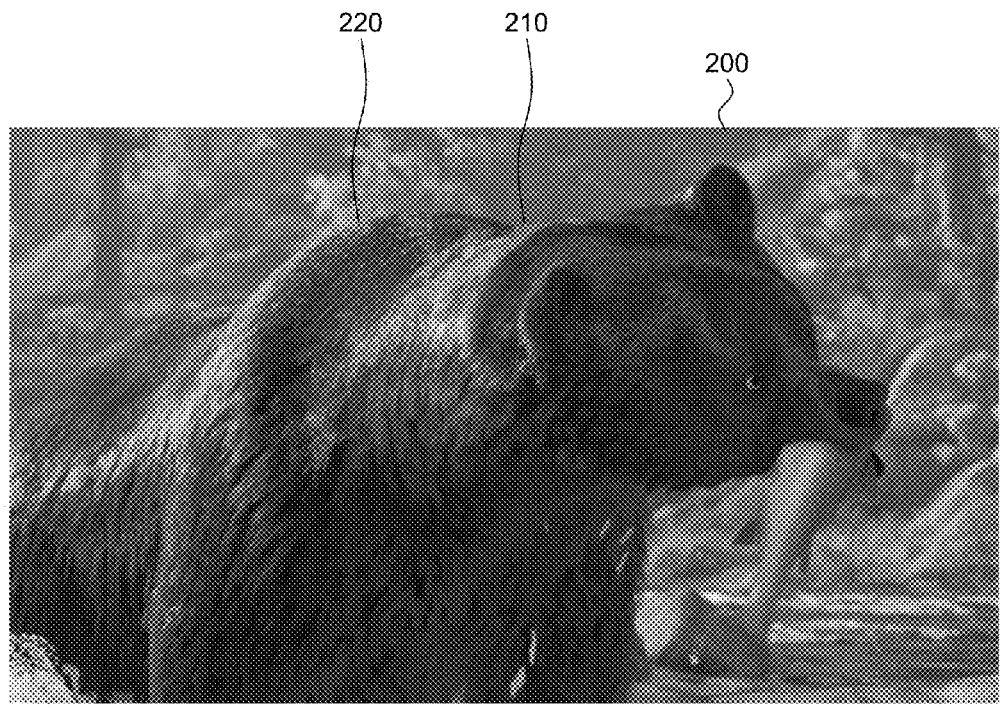
FIG. 2 is a rendered image that illustrates flesh deformation on an animated character, according to one embodiment of the present invention.

As used herein, flesh simulation is a surface simulation that moves muscle mass and skin of an object. Flesh simulation is configured to change the silhouette, or profile, of the object, also knowing as "breaking profile" of the object. As such, flesh simulation provides dynamic ballistic motion with the potential to alter the shape of the object. In contrast, skin simulation is a surface simulation that moves the skin of an object within the same silhouette of the object. That is, skin simulation does not break profile of the object. As such, skin simulation provides dynamic ballistic motion without altering the shape of the object Skin and Flesh Simulation Using Biphasic Materials FIG. 2 is a rendered image 200 that illustrates flesh deformation on an animated character, according to one embodiment of the present invention. As shown, the rendered image 200 includes regions of lightly deformed flesh 210 and highly deformed flesh 220.

Regions of lightly deformed flesh 210 are simulated using a relatively low stiffness value that allows for natural secondary volumetric and sliding motion to appear under slow speeds. For example, such a stiffness value would allow for the flesh on an animated bear to ripple naturally as the bear moves.

Regions of highly deformed flesh 220 are simulated using a relatively high stiffness value, providing resistance to further deformations at high accelerations to avoid over-stretching. For example, such a stiffness value would reduce further deformation of the flesh on the animated bear when the bear experiences rapid changes in momentum.

Flesh, or other material, modeled in such a manner may be called biphasic materials. Biphasic materials are simulated materials where some aspect or parameter of the material changes as the displacement of the material increases. Such displacement may be measured by the deformation of the mesh that defines the underlying animated character. For example, such aspect could include, without limitation, stiffness, hardness, or Young's modulus. The simulation application measures the deformation of a character and chooses the stiffness, or other parameter, based on the current deformation. In one example, the simulation application could choose one stiffness value if the deformation is below a threshold value and a different stiffness value if the deformation is above the threshold. This allows more stretch when deforming from a rest state, and less stretch with the material approaches a limit.

Where multiple aspects or parameters of the material change as the displacement increases, the material may be called a multi-phasic material. In some embodiments, a proper biphasic, or multi-phasic, configuration may result in a material that renders appropriately according to the biphasic, or multi-phasic, configuration, with minimal or no manual manipulation of the biphasic, or multi-phasic, aspect or parameter of the material.

Such biphasic materials model nonlinear stretching behavior. In particular, biphasic material may be used to model the increase in resistance to deformation that occurs as flesh is stretched or compressed. The biphasic material allows the simulation to automatically adapt, both spatially and temporally in a continuous manner, as the energy states in the animation change over time. Biphasic material may be similarly beneficial for modeling sliding skin. Skin modeled as biphasic material provides low stiffness at low deformation, resulting in high quality dynamic motion. The stiffness of biphasic skin increases at higher deformation, reducing stretch and strain, reducing the tendency of the skin to stretch unrealistically across portions of the character or compress and fold over in other portions of the character. Because this approach provides a more realistic response under a wider variety of deformation conditions, less per-shot adjustment is needed to create a visually pleasing effect.

Figure 3:
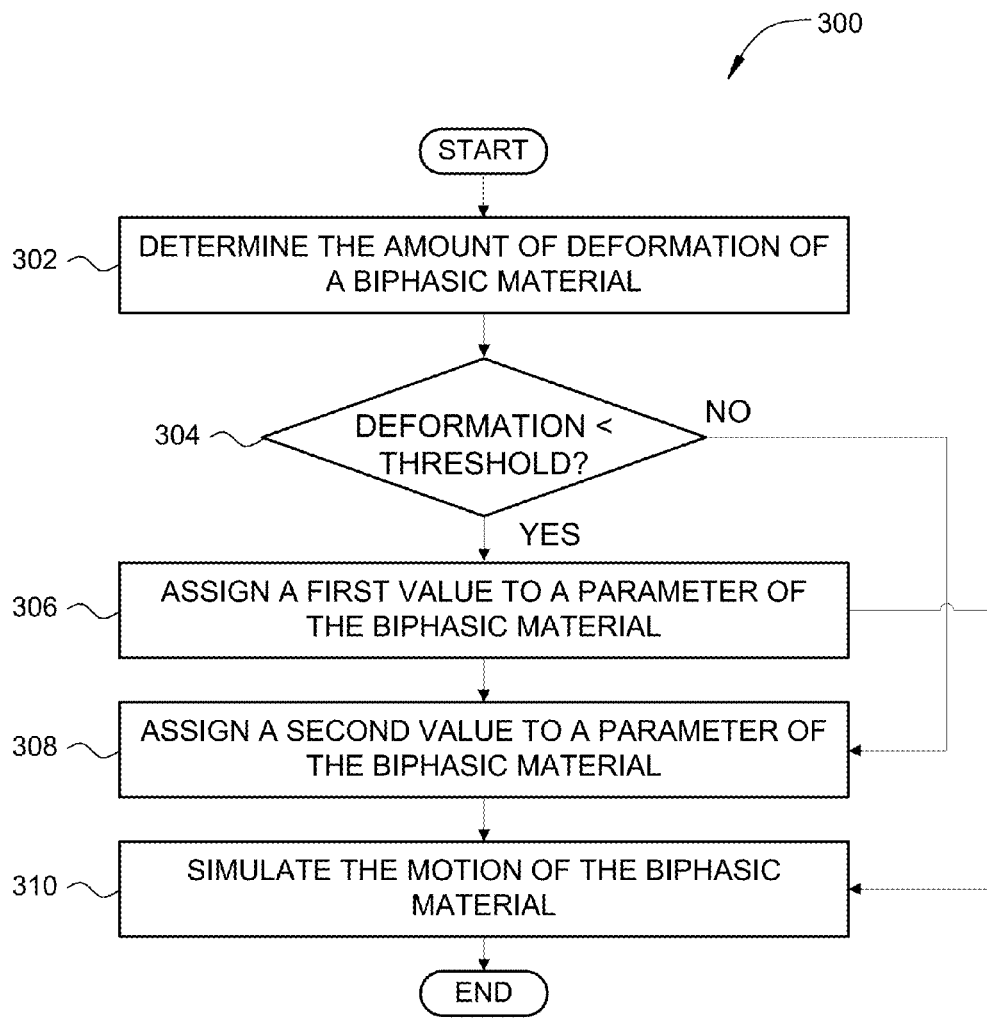
FIG. 3 sets forth a flow diagram of method steps for simulating flesh using biphasic material, according to one embodiment of the present invention.

FIG. 3 sets forth a flow diagram of method steps for simulating flesh using biphasic material, according to one embodiment of the present invention. Although the method steps are described in conjunction with the systems of FIG. 1, persons of ordinary skill in the art will understand that any properly configured computing system is within the scope of the present invention, where such a computing system may include a processing unit configured to perform the method steps described herein. Such processing units may include, without limitation, one or more central processing units (CPUs), one or more multi-core CPUs, one or more parallel processing units (PPUs), one or more graphics processing units (GPUs), one or more special purpose processing units, or the like. Further, although the method steps are described in conjunction with a processing unit, persons skilled in the art will understand that any system configured to perform the method steps, in any order, is within the scope of the present invention.

As shown, a method 300 begins at step 302, where a software application, such as a physics-based simulation software application, determines the amount of deformation at various locations on a biphasic material. At step 304, the software application determines whether the deformation at a particular location is less than a threshold value. If the deformation is less than the threshold value, then the method 300 proceeds to step 306 where the software application assigns a first value to a parameter associated with the biphasic material. For example, the software application could assign a low stiffness value to the biphasic material. At step 310, the software application simulates the motion of the biphasic material based on the first value. The method 300 then terminates.

Returning to step 304, if the deformation is not less than the threshold value, then the method 300 proceeds to step 308 where the software application assigns a second value to a parameter associated with the biphasic material. For example, the software application could assign a high stiffness value to the biphasic material. At step 310, the software application simulates the motion of the biphasic material based on the second value. The method 300 then terminates.

Skin Simulation Using Finite Element Models

Figure 4:
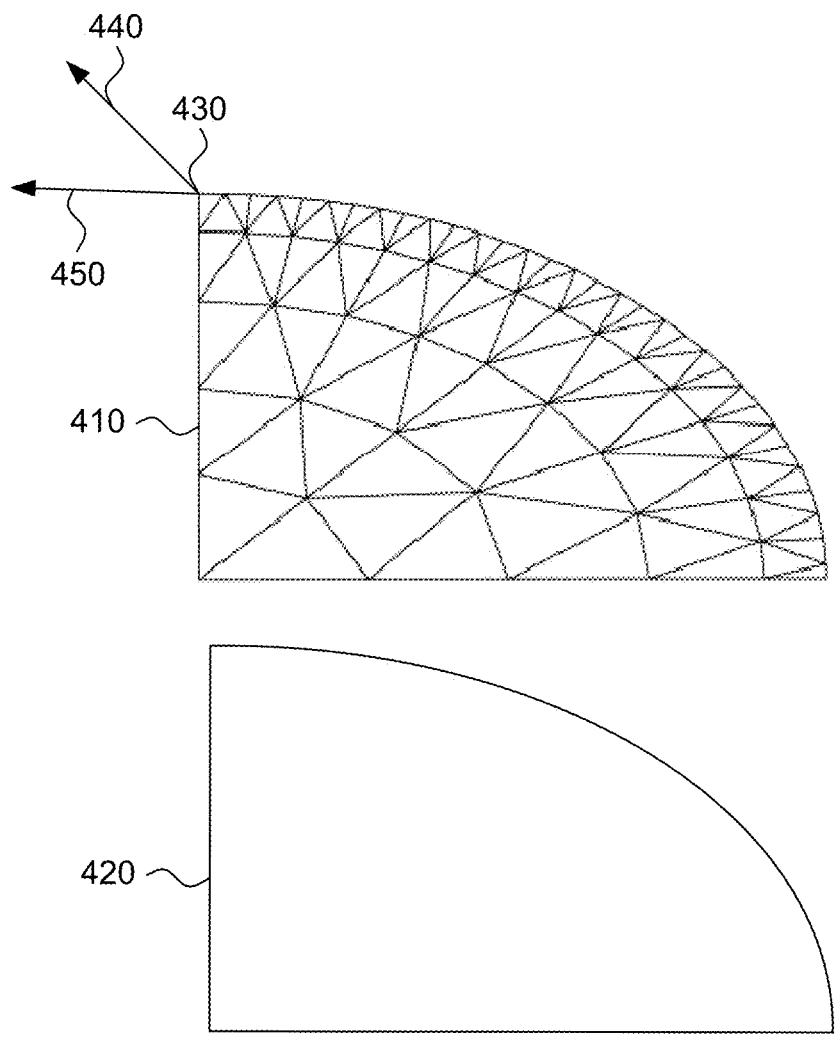
FIG. 4 illustrates skin simulation using a finite element model, according to one embodiment of the present invention.

FIG. 4 illustrates skin simulation using a finite element model, according to one embodiment of the present invention. As shown, the illustration includes a simulation mesh 410 and an animated target 420.

The simulation mesh 410 is a finite element model (FEM) defined by nodes 430, such as node 430, which are interconnected to form a mesh of triangles. A FEM is a computer animatable model of an object that is formed by sub-dividing the object into smaller sub-objects. The model includes a description of the forces between and among the sub-objects. In one example, two balls could be connected by a spring. In a typical model not employing FEM, the motion simulation would treat the spring as a single unit, where the length of the spring is the only degree of freedom of the object's motion. In such a case, the spring would not exhibit bending or non-uniform stretching. In a FEM, the spring would be divided into many small sub-objects where the forces between adjacent sub-objects would be described. As a result, the FEM would allow non-uniform stretching, bending, and other complex motion. A series of forces allows the FEM skin mesh to travel along the surface of the animated and articulated models. The surface of the animated and articulated object is duplicated to form the simulation mesh 410, as well as the animated target 420, described below.

The animated target 420 derives from the surface of the animated and articulated object. As the animated object moves during the simulation, the animated target 420 follows the same motion pattern. As further described below, forces between the simulation mesh 410 and the animated target 420 allow the skin of an object to move differently from the animated target 420, while, at the same time, cause the skin to tend to return to an original rest position with respect to the animated target 420. The simulation mesh 410 slides over the animated target 420, although the simulation mesh 410 slides does not break profile of the object.

Given the animated target 420, such as the target surface generated from the flesh simulation, as described above, sliding skin is simulated, where the sliding skin accurately tracks the animated target 420. For sliding motion, the triangular FEM of the skin surface mesh 410 is simulated to track the surface generated by the flesh simulation. The finite element formulation enables accurate modeling of realistic stretching and compression behavior in the skin. The skin simulation mesh 410 is bound to the surface of the animated target 420 by two independent constraint forces applied at each node 430.

The first constraint force is a sliding force 440 that is normal to the surface of the animated target 420. The sliding force 440 is associated with a high stiffness value in order to accurately preserve the shape of the object. As the dynamic surface mesh 410 moves along the animated target 420, the sliding force 440 projects the sliding force 440 projects each node 430 of the surface mesh 410 onto the animated target 420, finding the closest point on the animated target 420. The sliding force 440 acts similarly to a zero-length spring that is integrated in a fully implicit closed-form manner so as not to affect the time step for the simulation. As further described below, the time step is the amount of time between two successive simulations performed by the simulation application. The sliding force 440 is relatively strong, in order to avoid the skin breaking profile of the object.

The second constraint force is a targeting force 450 that is tangent to the surface of the animated target 420. The targeting force 440 is associated with a low stiffness value in order to allow loose sliding motion of the surface mesh 410 over the animated target 420. The targeting force 450 acts similarly to a zero-length spring that attempts to return the nodes 430 of the surface mesh 410 back to where the nodes' 430 corresponding points animated target 420 are located. The targeting force 450 is relatively weak, allowing the nodes 430 to return to the original position in a fluid manner.

To construct the two constraint forces, each node 430 of the skin mesh is bound to the closest point on the animated target 420. As the skin simulation progresses, the binding point is updated with each time step. The update of each binding point is limited to a topologically local region in the animated target 420 to avoid sudden jumps in the binding when the animated target 420 has geometric folds. Such folds may originate from both the keyframe animation, provided as an input to the simulation, and from the flesh simulation. As these two constraint forces are independent from each other, the constraint forces may be applied sequentially, without requiring the construction and solution of a linear system of the combined forces.

In some embodiments, a bending model is added to the surface mesh 410, providing for the simulation of surface materials that break profile such as cloth, or of skin that includes surface aberrations such as crow's feet around the eyes, wrinkles, and jowls.

Figure 5:
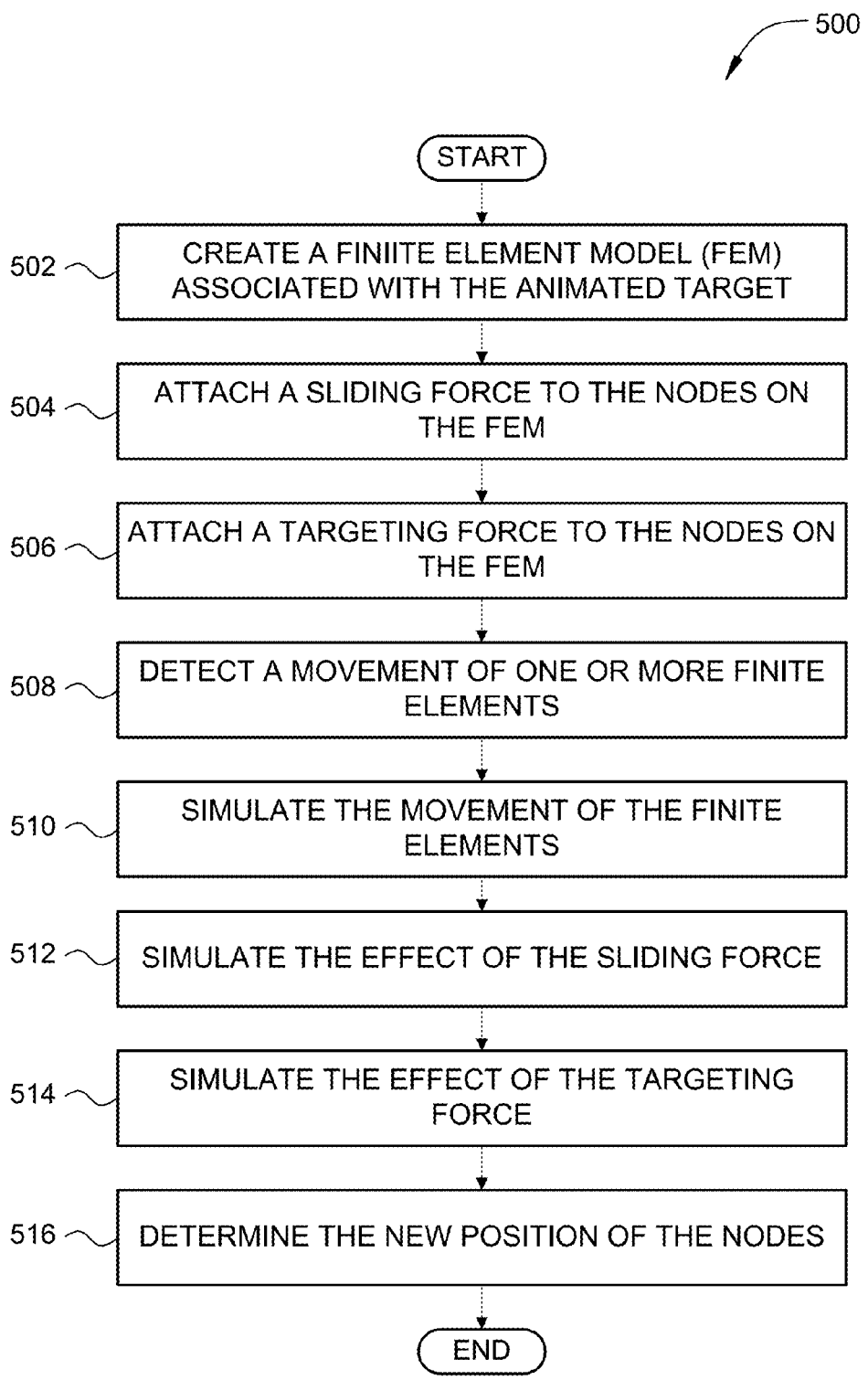
FIG. 5 sets forth a flow diagram of method steps for simulating skin using a finite element model, according to one embodiment of the present invention.

FIG. 5 sets forth a flow diagram of method steps for simulating skin using a finite element model, according to one embodiment of the present invention. Although the method steps are described in conjunction with the systems of FIG. 1, persons of ordinary skill in the art will understand that any properly configured computing system is within the scope of the present invention, where such a computing system may include a processing unit configured to perform the method steps described herein. Such processing units may include, without limitation, one or more central processing units (CPUs), one or more multi-core CPUs, one or more parallel processing units (PPUs), one or more graphics processing units (GPUs), one or more special purpose processing units, or the like. Further, although the method steps are described in conjunction with a processing unit, persons skilled in the art will understand that any system configured to perform the method steps, in any order, is within the scope of the present invention.

As shown, a method 500 begins at step 502, where a software application, such as a physics-based simulation software application, creates a finite element model (FEM) associated with the animated target. At step 504, the software application attaches a sliding force 440 to each of the nodes 430 on the FEM, such that the sliding force 440 is normal to each node. At step 506, the software application attaches a targeting force 450 to each of the nodes 430 on the FEM, such that the targeting force 450 is tangential to each node. At step 508, the software application detects a movement of the FEM that affects one or more finite elements. At step 510, the software application simulates the movement of the finite elements. At step 512, the software application simulates the effect of the sliding force 440 at each node. At step 514, the software application simulates the effect of the targeting force 450 at each node. At step 516, the software application determines the new position of each node 430 based on the movement of the finite elements, the sliding force 440 and the targeting force 450. The method 500 then terminates.

Time Integration

The two constraint forces may be explicitly or implicitly integration with the other simulation objects in the simulation application.

With explicit time integration, the current state of the world space defined by the simulation is examined to determine the next state as of the next time step. The time step is the duration between two adjacent points on the simulation timeline. A shorter time step may result in more stable motion and better dynamic fidelity at an increased computational cost. A higher time step reduces the computational cost of the simulation at the sacrifice of motion stability and dynamic fidelity. Typically, the time step is less than the time between two successive image frames. Depending on the current time step, explicit integration may provide stable or unstable motion, depending on the time step and the models being simulated. Unstable motion may become stable by decreasing the time step, at increased computational cost. Explicit time integration provides more dynamic fidelity than implicit time integration, but explicit time integration can result in energy gain in the system, which may be objectionable.

Typically, explicit time integration is not fully explicit time integration, but rather semi-implicit time integration. For example, elastic components and forces could be integrated with explicit time integration while inelastic components and forces could be integrated with implicit time integration. Such an approach provides models for damping components to improve stability over fully explicit time integration.

With implicit time integration, a system of equations is solved in order to resolve a future state of an object. For example, the future state of the object could be resolved by solving a system of closed form equations. Some combination of future state and current state is used to move object forward in time. Implicit time integration is typically more stable than explicit time integration, but implicit time integration can result in energy loss in the system, which may be objectionable.

For the skin simulation approach described herein, a hybrid time integration approach is employed, where some forces are resolved or integrated semi-implicitly, while other forces are resolved or integrated fully implicitly. Typically, semi-implicit forces are resolved for multiple time steps per frame in order to maintain numerical stability. Fully implicit forces are closed form and do not impose such time stepping restrictions. Fully implicit forces may be resolved once for each frame, while maintaining numeric stability. For aspects of a motion simulation where dynamic fidelity is important, such as when finite elements are deformed, semi-implicit integration is used. In such a case, the duration of the time step used to resolve or integrate forces is adaptively derived or driven by the forces themselves, based on the rate of deformation of the object. Where forces contribute less to the dynamic aesthetic of a material, such as in the case of targeting constraints, the time step is not so limited, and such forces may be resolved or integrated once per frame.

The constitutive models described herein are updated using an adaptive, semi-implicit time stepping scheme to efficiently retain realistic dynamics in the deformation response. However, the sliding forces 440 typically have high stiffness values, which may drive down the step size. In addition, allowing sliding forces 440 to drive the time step would work to resolve, and thus make visible, high frequency oscillations in the sliding forces 440, which are aesthetically objectionable. To address these issues, the skin simulation employs a hybrid time integration approach. The sliding forces 440 are updated via fully implicit time integration, thereby avoiding the need to reduce the simulation time step in order to retain stability. Fully implicit time integration also dampens out high frequency oscillations of the sliding forces 440, without reducing the quality of the deformation response.

The weaker targeting forces 450 may be modeled within the simulation without significantly impacting the time step, resulting in dynamic fidelity in motion related to the targeting force 450. Alternatively both the sliding forces 440 and the targeting forces 450 could be simulated via fully implicit time integration, but this could resulting in dampening of desirable dynamic response when practical step sizes are used.

The triangle elements of the FEM are integrated into the time step in order to properly resolve the dynamic behavior of the FEM. If left unconstrained, the FEM would deform too far and the simulator would have difficulty getting the FEM back into proper bounds. The time step related to the FEM simulation could be determined via a threshold approach. For example, if at a current time step, a triangle within the FEM deforms by more than plus or minus 10% between adjacent time steps, then the time step could be decreased (more time steps per unit time) until the maximum deformation is no more than 10% in one time step. If the maximum deformation a triangle within the FEM is less than another threshold (e.g. 5%), the time step could be increased (fewer time steps per unit time) to improve performance.

Various elements of the skin simulation may be time integrated differently, based on the impact on the time step and the desired dynamic fidelity associated with each of the forces. In some embodiments, the sliding forces 440 may be simulated using fully implicit time integration. The FEM may be simulated using fully explicit time integration. A user selection may determine whether the targeting forces 450 are simulated via fully implicit time integration or semi implicit time integration. Such an approach provides artistic control over time integration of the targeting forces 450.

Rest State Retargeting

Figure 6:
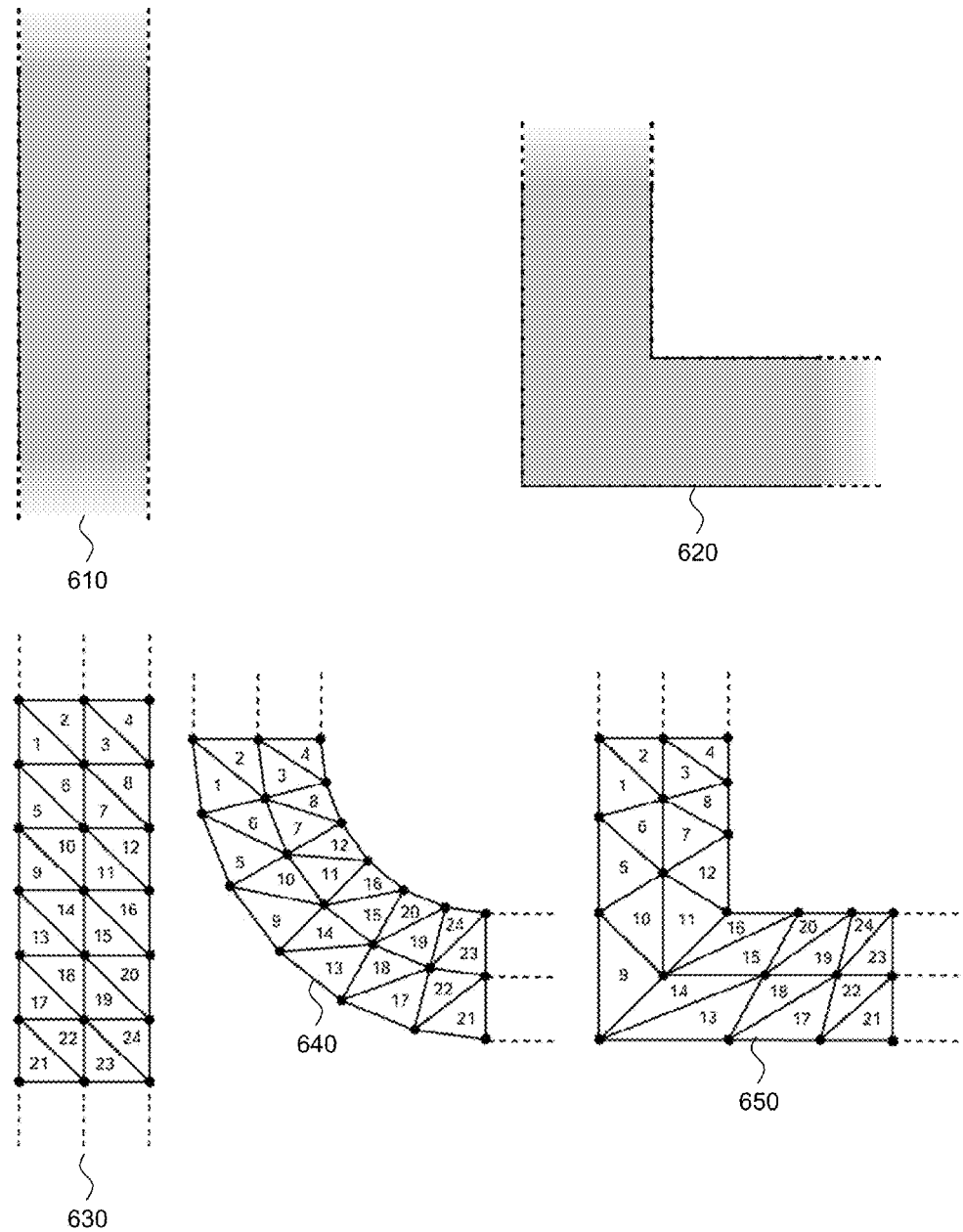
FIG. 6 illustrates rest state retargeting, according to one embodiment of the present invention.

FIG. 6 illustrates rest state retargeting, according to one embodiment of the present invention. As shown, the illustration includes an input animation initial state 610, an input animation final state 620, a simulation mesh initial state 630, a simulation mesh final state without rest state retargeting 640, and a simulation mesh final state with rest state retargeting 650.

The input animation initial state 610 illustrates an animated surface at an initial time $t_0$ when the simulation begins.

The input animation final state 620 illustrates the animated surface at a later time $t_{0+n}$, in the simulation where n>0.

The simulation mesh initial state 630 illustrates the initial discretized simulation mesh corresponding to the input animation initial state 610 at an initial time $t_0$.

The simulation mesh final state without rest state retargeting 640 illustrates the discretized simulation mesh simulation mesh in a rest state at a later time $t_{0+n}$ without applying a rest state retargeting. The simulation mesh final state without rest state retargeting 640 depicts the result of a physics-based simulation. While the deformation may be physically correct, simulation mesh final state without rest state retargeting 640 depicts an incorrect result, as compared with the desired outcome as illustrated by the input animation final state 620.

The simulation mesh final state with rest state retargeting 650 illustrates the discretized simulation mesh in a rest state at a later time $t_{0+n}$ with rest state retargeting.

As shown, the simulation mesh final state with rest state retargeting 650 corresponds to the shape of the desired object after deformation, as depicted by the input animation final state 620. The simulation mesh final state with rest state retargeting 650 accurately depicts the results of the simulation, where the simulation is executed until an equilibrium state is reached, without external influences such as force or acceleration. In one example, the distribution of interior vertices shown in the simulation mesh initial state 630 and the simulation mesh final state with rest state retargeting 650 could result from using an energy minimization function (e.g., elliptic equation such as a Laplace equation) to derive a rest state for the simulation mesh.

Rest state retargeting is an animation method that changes the rest state of the finite elements within a finite element model (FEM) to match an animated pose. Typically, rest state retargeting is performed gradually over a period of time steps in order to preserve ballistic motion. Rest state retargeting allows the FEM flesh simulation to track a target keyframe animation, by adaptively retarget the rest state of the tetrahedral mesh, while preserving ballistic energy. Rest state retargeting is also used to match the skin simulation to the shape of the animated target 420, by progressively altering the triangular rest states at each time step to match the animated target 420.

In some embodiments, the input mesh from the rigger may be ill-formed, including finite elements that are difficult to simulate, such as "sliver" triangles or "zero-area" triangles. Such an input mesh may be re-meshed (e.g. with a hexagonal mesher) to form a FEM with regularly shaped finite elements that are more or less equal in area. Such a re-meshed FEM may exhibit better behavior and reduced simulation times during skin simulation.

Various embodiments of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments and numerous specific details are set forth to provide a more thorough understanding of the invention. Persons skilled in the art, however, will understand that various modifications and changes may be made thereto without departing from the broader spirit and scope of the invention. The foregoing description and drawings are, accordingly, to be regarded in an illustrative rather than a restrictive sense.

What is claimed is:

1. A method of rendering a material associated with an animated target, the method comprising:
    creating a finite element model (FEM) comprising a plurality of finite elements based on an animated target;
    attaching, via one or more processors, a first constraint force to a node associated with a first finite element in the plurality of finite elements, the first constraint force being a sliding force that is normal to a surface of the animated target and projects nodes of the FEM onto the animated target;
    attaching, via the one or more processors, a second constraint force to the node, the second constraint force being a targeting force that is tangential to the surface of the animated target and attempts to return nodes of the FEM to where corresponding points in the animated target are located;
    detecting a movement of the first finite element that results in a corresponding movement of the node;
    determining a new position for the node based on the movement of at least one of the first finite element, the first constraint force, and the second constraint force; and
    rendering one or more image frames depicting the material based on at least the new position for the node,
    wherein the FEM is coupled to a biphasic material used to model the material associated with the animated target, and
    wherein a value for a parameter, which is associated with the biphasic material and changes as a displacement of the biphasic material increases, is determined based on whether or not a deformation of the biphasic material is below a threshold amount.

2. The method of claim 1, wherein the parameter of the biphasic material is one of a stiffness of the biphasic material, a hardness of the biphasic material, or a Young's modulus associated with the biphasic material.

3. The method of claim 1, wherein the new position for the node is further based on the deformation of the biphasic material.

4. The method of step 1, further comprising altering the shape of the FEM based on a target rest state associated with the animated target.

5. The method of claim 1, further comprising simulating the first constraint force by solving a system of closed form equations related to the first constraint force.

6. The method of claim 1, further comprising simulating the second constraint force via semi-implicit time integration with a time step associated with a simulation program.

7. The method of claim 1, further comprising simulating the movement of the FEM via fully explicit integration with a time step associated with the a simulation program.

8. A non-transitory computer-readable storage medium including instructions that, when executed by a processing unit, cause the processing unit to render a material associated with an animated target, by performing the steps of:
creating a finite element model (FEM) comprising a plurality of finite elements based on an animated target;
attaching a first constraint force to a node associated with a first finite element in the plurality of finite elements, the first constraint force being a sliding force that is normal to a surface of the animated target and projects nodes of the FEM onto the animated target;
attaching a second constraint force to the node, the second constraint force being a targeting force that is tangential to the surface of the animated target and attempts to return nodes of the FEM to where corresponding points in the animated target are located;
detecting a movement of the first finite element that results in a corresponding movement of the node;
determining a new position for the node based on the movement of at least one of the first finite element, the first constraint force, and the second constraint force; and
rendering one or more image frames depicting the material based on at least the new position for the node,
wherein the FEM is coupled to a biphasic material used to model the material associated with the animated target, and
wherein a value for a parameter, which is associated with the biphasic material and changes as a displacement of the biphasic material increases, is determined based on whether or not a deformation of the biphasic material is below a threshold amount.

9. The computer-readable storage medium of claim 8, wherein the parameter of the biphasic material is one of a stiffness of the biphasic material, a hardness of the biphasic material, or a Young's modulus associated with the biphasic material.

10. The computer-readable storage medium of claim 8, wherein the new position for the node is further based on the deformation of the biphasic material.

11. The computer-readable storage medium of step 8, further comprising the step of altering the shape of the FEM based on a target rest state associated with the animated target.

12. The computer-readable storage medium of claim 8, further comprising the step of simulating the first constraint force by solving a system of closed form equations related to the first constraint force.

13. The computer-readable storage medium of claim 8, further comprising the step of simulating the second constraint force via semi-implicit time integration with a time step associated with a simulation program.

14. The computer-readable storage medium of claim 8, further comprising the step of simulating the movement of the FEM via fully explicit integration with a time step associated with a simulation program.

15. A computing system, comprising:
a memory that is configured to store instructions for a program; and
a processor that is configured to execute the instructions for the program to render a material associated with an animated target, by performing the steps of:
creating a finite element model (FEM) comprising a plurality of finite elements based on an animated target;
attaching a first constraint force to a node associated with a first finite element in the plurality of finite elements, the first constraint force being a sliding force that is normal to a surface of the animated target and projects nodes of the FEM onto the animated target;
attaching a second constraint force to the node, the second constraint force being a targeting force that is tangential to the surface of the animated target and attempts to return nodes of the FEM to where corresponding points in the animated target are located;
detecting a movement of the first finite element that results in a corresponding movement of the node;
determining a new position for the node based on the movement of at least one of the first finite element, the first constraint force, and the second constraint force; and
rendering one or more image frames depicting the material based on at least the new position for the node,
wherein the FEM is coupled to a biphasic material used to model the material associated with the animated target, and
wherein a value for a parameter, which is associated with the biphasic material and changes as a displacement of the biphasic material increases, is determined based on whether or not a deformation of the biphasic material is below a threshold amount.

* * * * *